(12) United States Patent
Shim et al.

(10) Patent No.: US 7,008,820 B2
(45) Date of Patent: Mar. 7, 2006

(54) CHIP SCALE PACKAGE WITH OPEN SUBSTRATE

(75) Inventors: Il Kwon Shim, Singapore (SG); Kwee Lan Tan, Singapore (SG); Jian Jun Li, Singapore (SG); Dario S. Filoteo, Jr., Singapore (SG)

(73) Assignee: ST Assembly Test Services Ltd., Singapore (SG)

( * ) Notice: Subject to any disclaimer, the term of this patent is extended or adjusted under 35 U.S.C. 154(b) by 7 days.

(21) Appl. No.: 10/866,561

(22) Filed: Jun. 10, 2004

(65) Prior Publication Data

US 2005/0277227 A1 Dec. 15, 2005

(51) Int. Cl.
 H01L 21/44 (2006.01)
 H01L 21/48 (2006.01)
 H01L 21/50 (2006.01)

(52) U.S. Cl. .................. 438/108; 438/109; 438/118; 438/119; 438/122; 438/123; 438/124; 438/126; 438/613; 438/928

(58) Field of Classification Search .................. None
See application file for complete search history.

(56) References Cited

U.S. PATENT DOCUMENTS

| | | | |
|---|---|---|---|
| 6,110,650 A * | 8/2000 | Bhatt et al. ............... 430/313 |
| 6,225,028 B1 * | 5/2001 | Bhatt et al. ............... 430/311 |
| 6,235,554 B1 * | 5/2001 | Akram et al. .............. 438/109 |
| 6,515,356 B1 * | 2/2003 | Shin et al. .................. 257/678 |
| 6,531,337 B1 * | 3/2003 | Akram et al. .............. 438/108 |
| 6,531,338 B1 * | 3/2003 | Akram et al. .............. 438/108 |
| 6,537,848 B1 | 3/2003 | Camenforte et al. |
| 6,548,330 B1 * | 4/2003 | Murayama et al. ........ 438/127 |
| 6,569,712 B1 * | 5/2003 | Ho et al. .................... 438/121 |
| 6,706,564 B1 * | 3/2004 | Kim et al. .................. 438/125 |
| 6,790,710 B1 * | 9/2004 | McLellan et al. .......... 438/122 |
| 6,833,619 B1 * | 12/2004 | Jang et al. ................. 257/728 |
| 2002/0140085 A1 * | 10/2002 | Lee et al. ................... 257/724 |
| 2002/0187587 A1 * | 12/2002 | Akram et al. .............. 438/108 |
| 2003/0025199 A1 * | 2/2003 | Wu et al. ................... 257/724 |
| 2003/0143781 A1 * | 7/2003 | McLellan et al. .......... 438/127 |

* cited by examiner

*Primary Examiner*—David E. Graybill
(74) *Attorney, Agent, or Firm*—Mikio Ishimaru

(57) ABSTRACT

A method for manufacturing an integrated circuit package comprises forming a substrate by forming a core layer with a through opening and vias. A first conductive layer is formed on the core layer covering the through opening and a second conductive layer is formed on the core layer opposite the first conductive layer in the through opening and in the vias contacting the first conductive layer. An integrated circuit die is bonded to the second conductive layer and in the through opening. Connections are formed between the integrated circuit die and the second conductive layer, and the integrated circuit die and the connections are encapsulated.

11 Claims, 6 Drawing Sheets

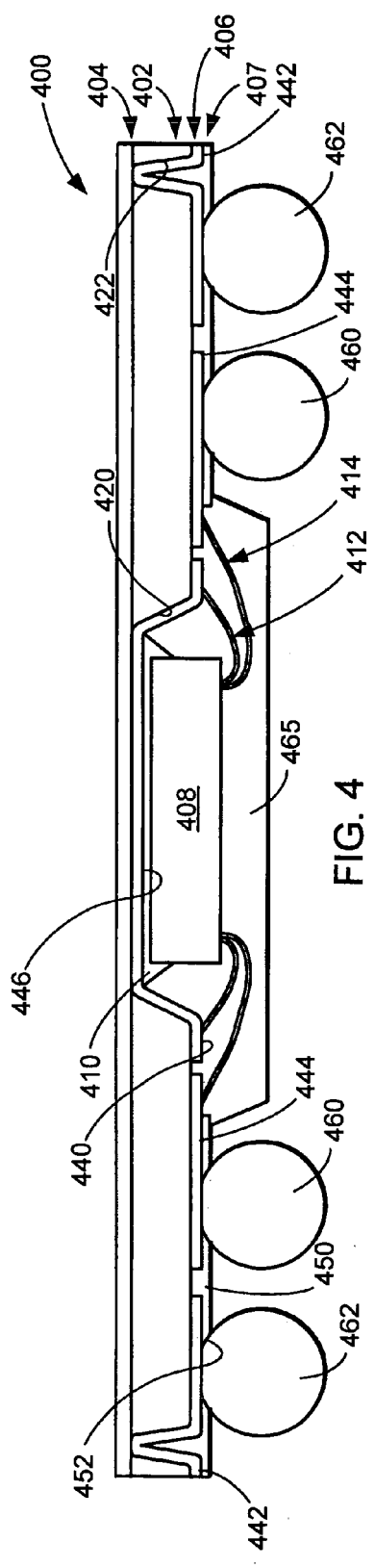
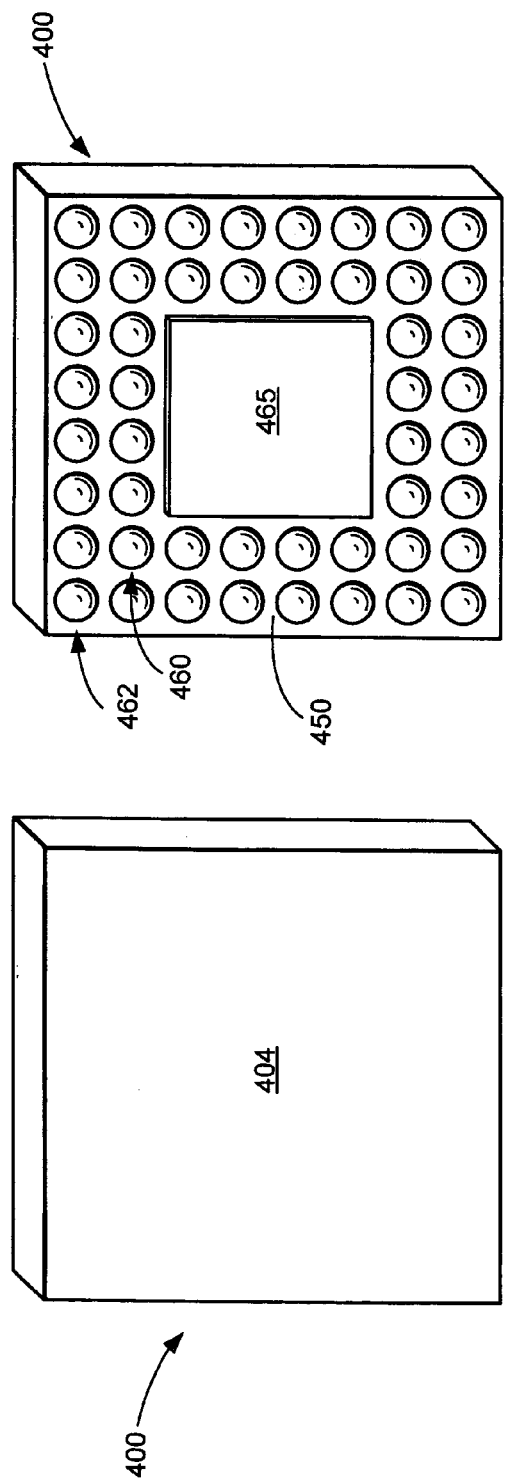
FIG. 4
FIG. 5
FIG. 6

CHIP SCALE PACKAGE WITH OPEN SUBSTRATE

TECHNICAL FIELD

The present invention relates generally to semiconductor packages, and more particularly to leadless and ball grid array chip scale packages.

BACKGROUND ART

As products such as video cameras and cell phones become smaller and smaller, the electronics industry is increasingly requiring increased miniaturization of integrated circuit packages. At the same time, higher performance and lower cost have become essential for new products.

Semiconductor devices are constructed from a silicon (Si) or gallium-arsenide (Ga/As) wafer through a process that comprises a number of deposition, masking, diffusion, etching, and implanting steps. Usually, many individual devices are constructed on the same wafer. When the devices are separated into individual groups of units, each takes the form of an integrated circuit die.

In order to interface a die with other circuitry, the dies are commonly mounted on a substrate that is surrounded by a number of lead fingers. Each die has bonding pads that are then individually connected in a wire bonding operation to the lead fingers and the assemblies are then packaged by individually encapsulating them in molded plastic, epoxy, or ceramic bodies. The lead fingers of the packages are then processed for attachment to a printed circuit board.

One type of package is the quad flat no lead (QFN) package. The QFN package has the die adhesively bonded to a lead paddle which, along with the lead fingers, is exposed. The QFN package has good electrical and thermal characteristics, however, to increase the number of input/outputs (I/O) for a given body size, it is necessary to reduce the width of the lead fingers and/or insert more rows of lead fingers. However, when the width of the lead fingers is decreased, handling problems are encountered during manufacturing.

Another type of package is the plastic land grid array (PLGA) in which a die is bonded to a paddle and the paddle is bonded to a substrate. The substrate has patterned metal on both sides and through vias connecting the patterned metal. The PLGA package is able to provide relatively high numbers of I/Os for a given body size over a QFN package. However, a liquid photoimageable (LPI) solder mask must be applied on both sides of the substrate exposing only the bonding areas. Adhesion between the LPI solder mask on large metal surfaces is poor, and the packages consistently have problems passing inspection, especially with regard to moisture resistance. In addition, solder mask registration and resolution cause problems because they affect bonding pad size. Further, there is a higher possibility of warpage in the event that solder mask volume or thickness between the top and the bottom is not balanced. In addition, the solder mask layer increases the thermal resistance from the chip to the printed circuit board resulting in inferior thermal dissipation compared to the QFN package.

Further, the PLGA package requires off-set vias requiring a connection between the via and the land.

Solutions to these problems have long been sought, but prior developments have not taught or suggested any solutions and, thus, solutions to these problems have long eluded those skilled in the art.

DISCLOSURE OF THE INVENTION

The present invention provides a method for manufacturing an integrated circuit package by forming a substrate by forming a core layer with a through opening and vias. A first conductive layer is formed on the core layer covering the through opening and a second conductive layer is formed on the core layer opposite the first conductive layer in the through opening and in the vias contacting the first conductive layer. An integrated circuit die is bonded to the second conductive layer and in the through opening. Connections are formed between the integrated circuit die and the second conductive layer, and the integrated circuit die and the connections are encapsulated.

This method provides for even heat dissipation, better electrical performance and adhesion as well as lower manufacturing costs.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 4 is a cross-sectional side view of an embodiment of a thermally/electrically enhanced super thin die down chip scale package in accordance with the present invention;

FIG. 5 is an isometric top side view of a first conductive layer of FIG. 4;

FIG. 6 is an isometric bottom side view of the structure of FIG. 4 including an encapsulant and solder balls;

BEST MODE FOR CARRYING OUT THE INVENTION

Figure 1:
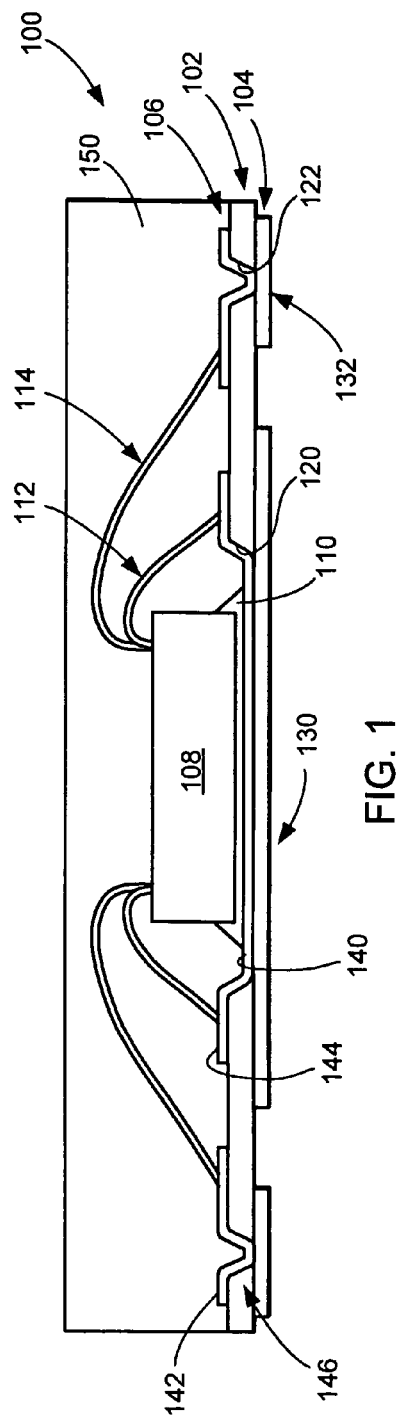
FIG. 1 is a cross-sectional side view of one embodiment of a thermally/electrically enhanced super thin die up chip scale package in accordance with the present invention.

Referring now to FIG. 1, therein is shown a cross-sectional side view of one embodiment of a thermally/electrically enhanced super thin die up chip scale package (CSP) 100 in accordance with the present invention. The CSP 100 includes a core layer 102 having a first conductive layer 104 and a second conductive layer 106 on opposite sides. The core layer 102 can be a non-conductive material such as such as thin core glass (bismaleimide triazine (BT)

resin), epoxy laminate, or polyimide and the first and second conductive layers 104 and 106 can be of conductive metals such as aluminum (Al), copper (Cu), and gold (Au).

An integrated circuit die 108 is bonded with a die attach adhesive 110 to the second conductive layer 106. The die attach adhesive 110 may be of thermally and/or electrically conductive or non-conductive material such as epoxy or glass. This increases the thermal dissipation capability of the present invention. The integrated circuit die 108 is connected by ground wires 112 and signal wires 114 to the second conductive layer 106. The ground and signal wires 112 and 114 are of such conductive materials as aluminum, copper, or gold.

The term "horizontal" as used herein is defined as a plane parallel to the conventional plane or surface of the integrated circuit die, regardless of its orientation. The term "vertical" refers to a direction perpendicular to the horizontal as just defined. Terms, such as "on", "above", "below", "bottom", "top", "over", and "under", are defined with respect to the horizontal plane.

In the following description, numerous specific details are given to provide a thorough understanding of the invention. However, it will apparent that the invention may be practiced without these specific details. In order to avoid obscuring the present invention, some well-known system configurations and process steps are not disclosed in detail.

Likewise, the drawings showing embodiments of the invention are semi-diagrammatic and not to scale and, particularly, some of the dimensions are for the clarity of presentation and are shown greatly exaggerated in the FIGs. In addition, where multiple embodiments are disclosed and described having some features in common, for clarity and ease of illustration and description thereof like features one to another will ordinarily be described with like reference numerals.

The term "processing" as used herein includes deposition of material or photoresist, patterning, exposure, development, etching, cleaning, and/or removal of the material or photoresist as required in forming a described structure.

The core layer 102 has a central opening 120 for containing the integrated circuit die 108 and a number of perimeter openings or vias 122 surrounding the central opening 120. The central opening 120 and the perimeter vias 122 extend through the core layer 102.

The first conductive layer 104 is processed to form a ground or thermal pad 130 surrounded by terminals 132. The ground or thermal pad 130 closes the central opening 120 in the core layer 102, and the terminals 132 close the perimeter vias 122 in the core layer 102.

The second conductive layer 106 is processed to form ground or thermal terminals 140 surrounded by a number of signal terminals 142. The ground or thermal terminals 140 extend through the central opening 120 of the core layer 102 to be in contact with the ground or thermal pad 130 of the first conductive layer 104. The ground or thermal terminals 140 further have an encircling ground ring 144 to which ground wires 112 are bonded. The signal wires 114 are bonded to the signal terminals 142.

The signal terminals 142 extend through the perimeter vias 122 in the core layer 102 to be in contact with the terminals 132 of the first conductive layer 104. While the perimeter vias 122 and the central opening 120 extend through the core layer 102, the signal terminals 142 and the ground or thermal terminal 140 effectively close off the openings to provide "blind" openings or "blind vias" so the openings effectively do not extend through the core layer 102.

The use of laser drilling of the vias eliminates problems related to mechanical routed or punched-through openings that can cause cracking problems.

In the present embodiment, no solder mask layer is required at the top and bottom layers, which results in better adhesion between the encapsulating material and the layers. This in turn means there is less moisture uptake. Further, because of the blind vias, there is no direct moisture pathway through to the integrated circuit die 108.

The integrated circuit die 108 is die up because of contact pads (not shown) on its top surface to which the ground wires 112 and the signal wires 114 are bonded.

The CSP 100 further includes an encapsulant 150, such as plastic or epoxy, encapsulating the second conductive layer 106, the integrated circuit die 108, the die attach adhesive 110, the ground wires 112, and the signal wires 114.

Figure 2:
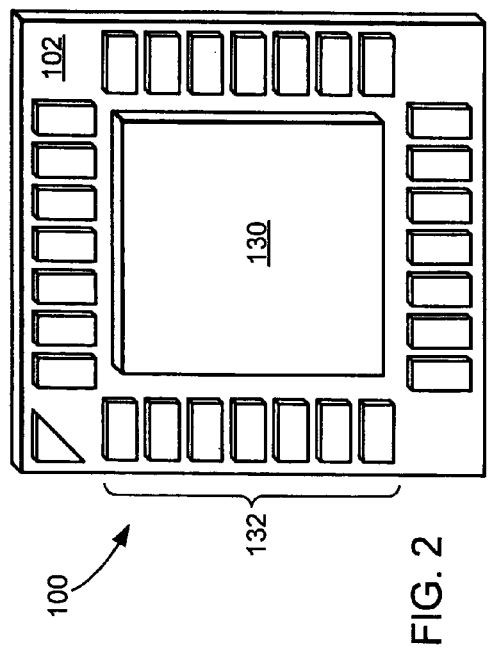
FIG. 2 is an isometric bottom side view of the structure of FIG. 1 including an encapsulant.

Referring now to FIG. 2, therein is shown an isometric bottom side view of the CSP 100. The ground or thermal pad 130 and the terminals 132 are shown raised. In the present invention, it has been discovered that terminals 132, which extend or protrude from the core layer 102, improve surface mount yield and solder joint reliability. Further, solder formation is improved around the vertical sides of the terminals 132.

Figure 3:
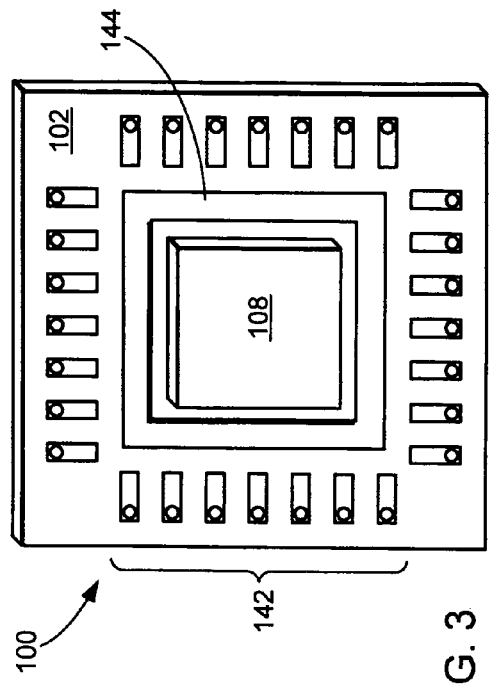
FIG. 3 is an isometric topside view of the structure of FIG. 1 without an encapsulant.

Referring now to FIG. 3, therein is shown an isometric topside view of the CSP 100 without the encapsulant 150. The integrated circuit die 108 is shown surrounded by the ground ring 144 and by the signal terminals 142. The ground wires 112 may be bonded any place along the ground ring 144 thereby increasing the possibility of heat transfer as well as multiple ground paths.

Referring now to FIG. 4, therein is shown a cross-sectional side view of an embodiment of a thermally/electrically enhanced super thin die down CSP 400. The CSP 400 includes a core layer 402 having a first conductive layer 404 and a second conductive layer 406 on opposite sides. The core layer 402 can be a non-conductive material such as such as thin core glass (bismaleimide triazine resin), epoxy laminate, or polyimide and the first and second conductive layers 404 and 406 can be of conductive metals such as aluminum, copper, or gold.

An integrated circuit die 408 is bonded with a die attach adhesive 410 to the second conductive layer 406. The die attach adhesive 410 may be of thermally and/or electrically conductive or non-conductive material such as epoxy or glass. The integrated circuit die 408 is connected by ground wires 412 and signal wires 414 to the second conductive layer 406. The ground and signal wires 412 and 414 are of materials such as aluminum, copper, or gold.

The core layer 402 has a central opening 420 for containing the integrated circuit die 408 and a number of perimeter openings or vias 422 surrounding the central opening 420. The central opening 420 and the perimeter vias 422 extend through the core layer 402.

The first conductive layer 404 closes the central opening 420 and the perimeter vias 422 in the core layer 402, and forms a ground or thermal pad.

The second conductive layer 406 is processed to form ground or thermal terminals 440 and 442 with a number of signal terminals 444 in between. The ground or thermal terminals 440 extend through the central opening 420 of the core layer 402 to form a ground or thermal pad 446 in contact with the first conductive layer 404. This means that no additional processes or material are required for a silicon substrate backside ground. Similarly, the ground or thermal terminals 442 extend through the perimeter openings or vias 422 to form blind vias in contact with the first conductive layer 404. It will also be understood from this disclosure that, if the first conductive layer 404 is patterned, the ground or thermal terminals 442 can be used as signal terminals.

The integrated circuit die 408 is die down because of contact pads on its top surface, which faces down, to which the ground wires 412 and the signal wires 414 are bonded.

A solder mask 450 is formed on the second conductive layer 406 with a number of through openings 452 to the second conductive layer 406. Solder balls 460 are formed in contact with the signal terminals 444 through the solder mask 450, and solder balls 462 are formed in contact with the ground terminals 462 through the solder mask 450.

The CSP 400 further includes an encapsulant 465, such as plastic or epoxy, encapsulating the second conductive layer 406, the integrated circuit die 408, the die attach adhesive 410, the ground wires 412, and the signal wires 414.

Referring now to FIG. 5, therein is shown an isometric top side view of the first conductive substrate 404 as the ground or thermal pad.

Referring now to FIG. 6, therein is shown an isometric bottom side view of the CSP 400 showing the encapsulant 465, the solder mask 450, and the solder balls 460 and 462.

Figure 7:
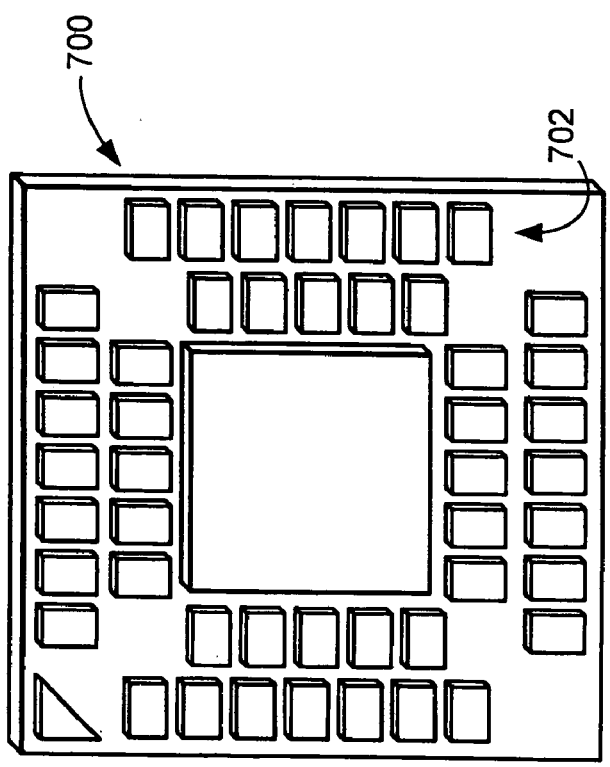
FIG. 7 is a bottom view of a chip scale package with rectangular-shaped dual rows of terminals.

Referring now to FIG. 7, therein is shown a bottom view of a CSP 700 having rectangular-shaped dual rows of terminals 702.

Figure 8:
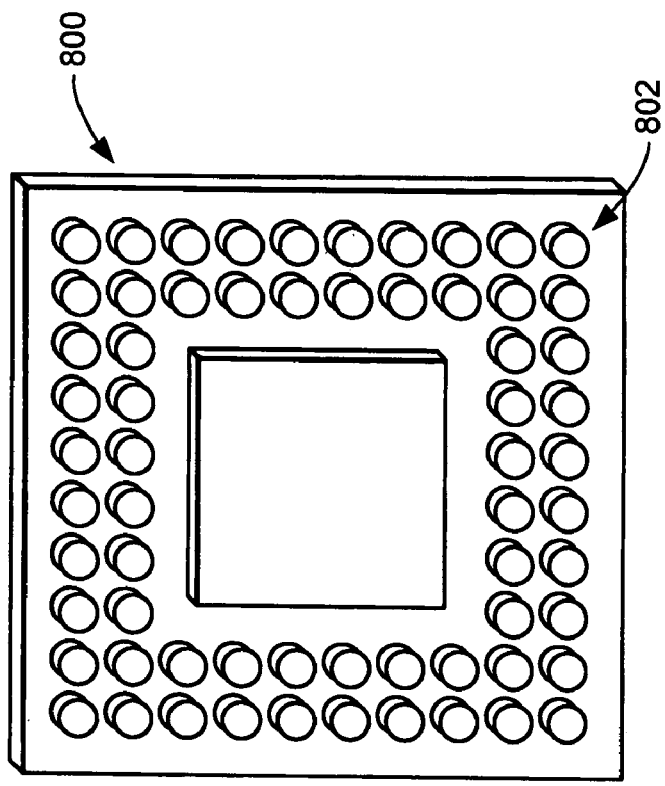
FIG. 8 is a view of a chip scale package with circular-shaped dual rows of terminals.

Referring now to FIG. 8, therein is shown a CSP 800 having circular-shaped dual rows of terminals 802.

Figure 9:
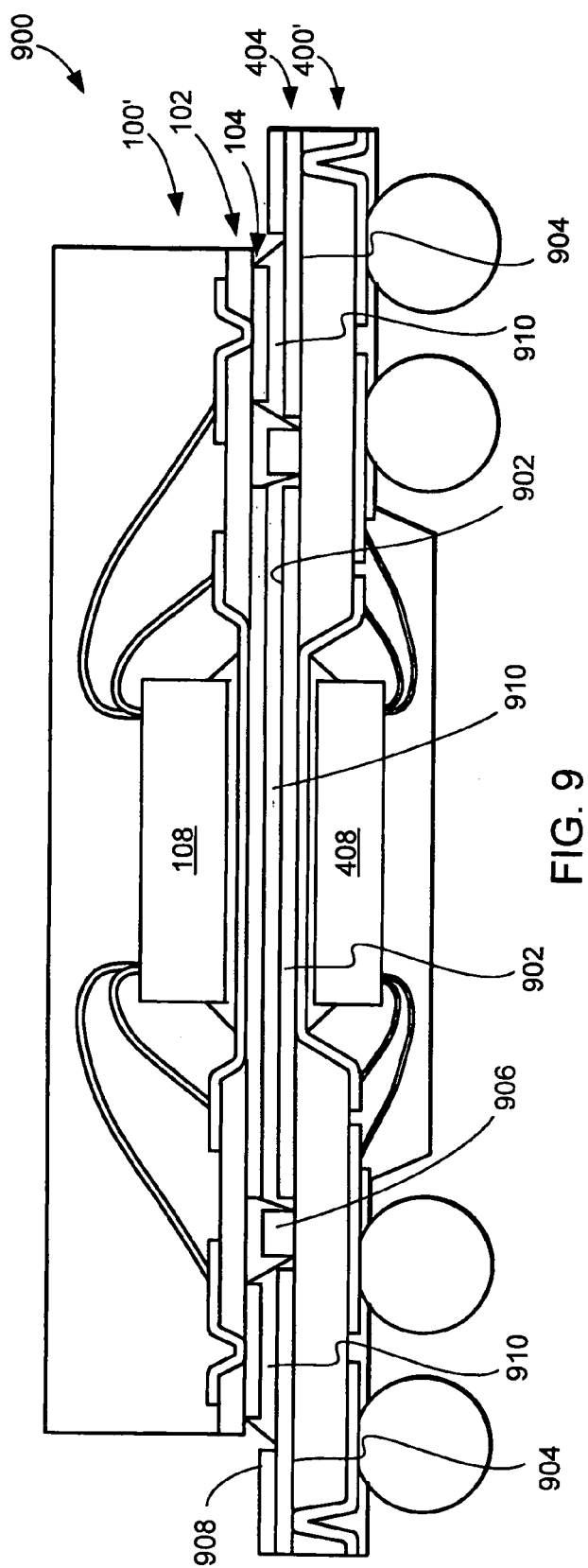
FIG. 9 is a view of a package-to-package stack in accordance with an additional embodiment of the present invention.

Referring now to FIG. 9, therein is shown a package-to-package stack 900 in accordance with an additional embodiment of the present invention. The package-to-package stack 900 by way of example and for ease of explanation includes a CSP package 100' stacked on and surface mounted to a modified version of the CSP package 400'.

The first conductive layer 404 is processed to form a central ground or thermal pad 902 surrounded by terminals 904. The central ground or thermal pad 902 is separated by an insulator ring 906 from the terminals 904. A solder paste 910 is used to bond the first conductive layer 104 of the CSP 100' to the first conductive layer 404 of the CSP 400'. There are numerous ways for making various signal and ground wire connections between the integrated circuit dice and the solder balls as would be evident from the above description.

Figure 10:
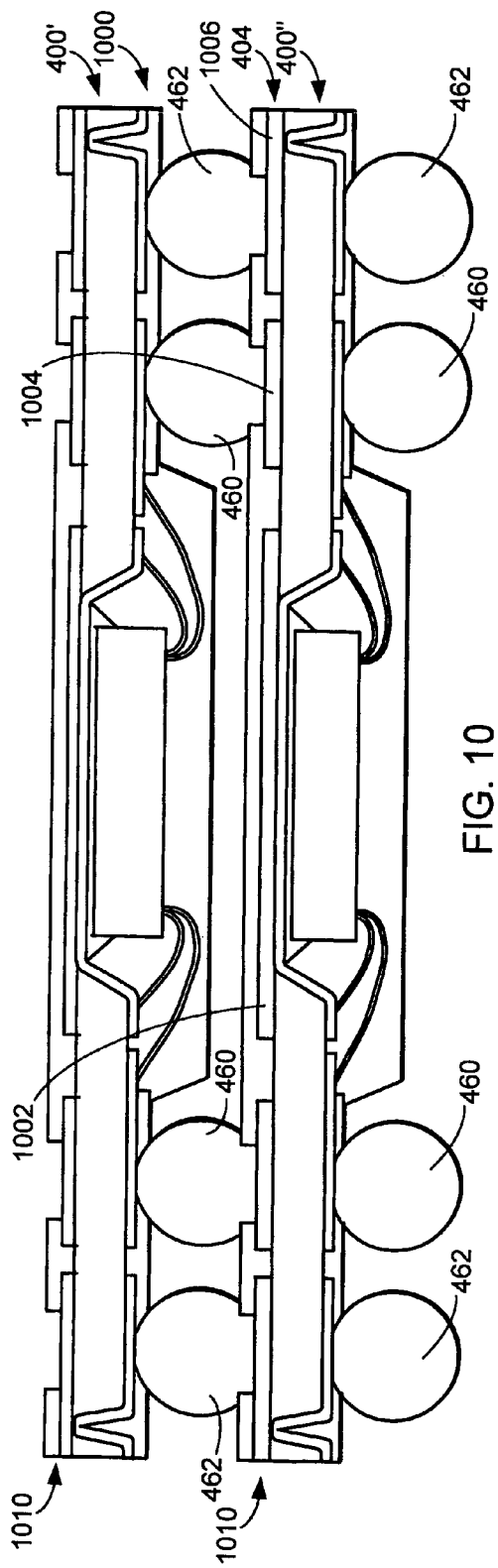
FIG. 10 is a view of a multi-package-to-package stack in accordance with a further embodiment of the present invention.

Referring now to FIG. 10, therein is shown a multi-package-to-package stack 1000 in accordance with a further embodiment of the present invention. The multi-package-to-package stack 1000 by way of example and for ease of explanation includes a modified CSP packages 400' on top of a modified CSP package 400".

The first conductive layer 404 of the CSP package 400" is processed to form terminals 1002, 1004, and 1006. The solder balls 460 and 462 of the CSP package 400' are respectively ball-bonded to the terminals 1004 and 1006 of the CSP package 400". There are numerous ways for making various signal and ground wire connections between the integrated circuit dice and the solder balls as would be evident from the above description.

Figure 11:
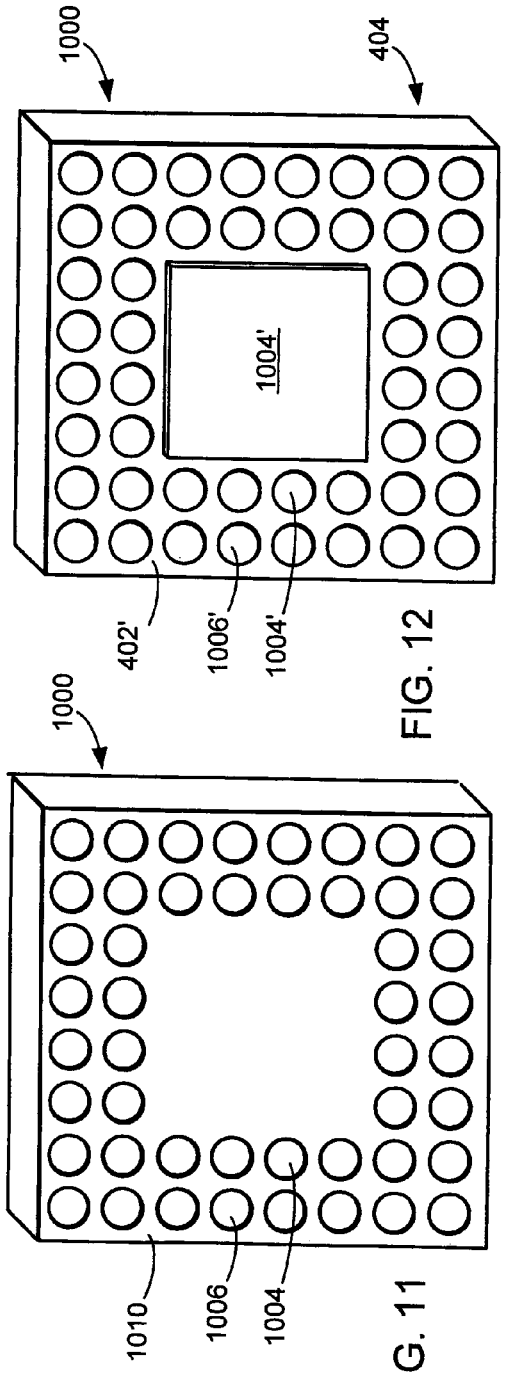
FIG. 11 is an isometric top side view of the structure of FIG. 10 with an optional solder mask.

Referring now to FIG. 11, therein is shown an isometric top side view of the multi-package-to-package stack 1000 in accordance with the present invention. The multi-package-to-package stack 1000 has an solder mask 1010 having openings through which the terminals 1004 and 1006 are accessed.

Figure 12:
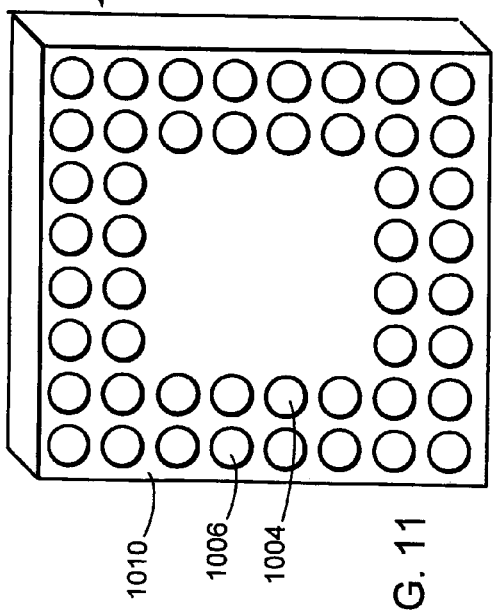
FIG. 12 is an isometric topside view of the structure of FIG. 10 without a solder mask.

Referring now to FIG. 12, therein is shown an alternative isometric top side view of the multi-package-to-package stack 1000. The multi-package-to-package stack 1000 is without a solder mask and shows a core layer 402' and uses circular-shaped dual row of the solder pads 1002', 1004', and 1006', which protrude outward for solder ball contact.

Figure 13:
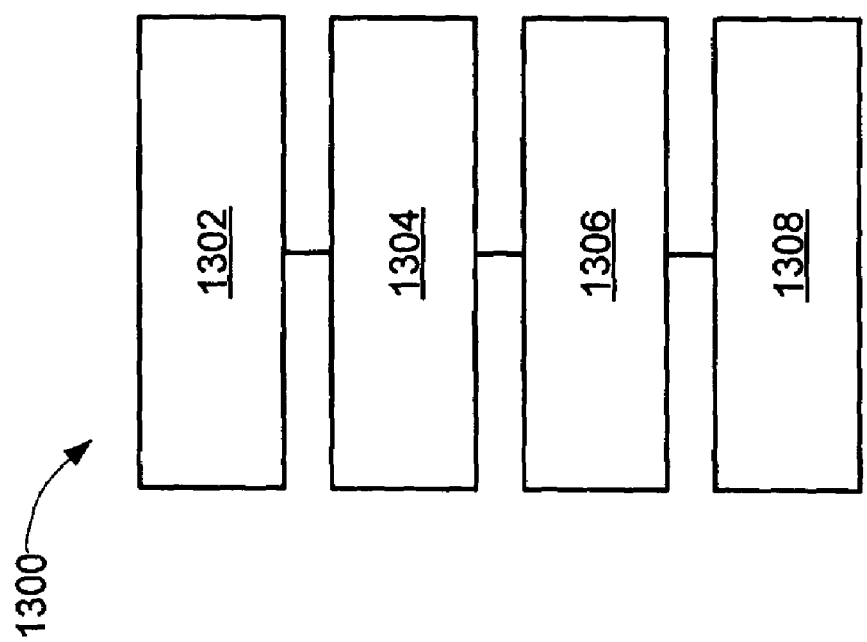
FIG. 13 shows a method of manufacturing an integrated circuit package.

Referring now to FIG. 13, therein is shown a method 1300 for manufacturing an integrated circuit package. The method 1300 includes: a block 1302 of forming a substrate by forming a core layer, forming a through opening and vias in the core layer, forming a first conductive layer on the core layer covering the through opening, and forming a second conductive layer on the core layer opposite the first conductive layer in the through opening and in the vias contacting the first conductive layer; a block 1304 of bonding an integrated circuit die to the second conductive layer and in the through opening; a block 1306 of forming connections between the integrated circuit die and the second conductive layer; and a block 1308 of encapsulating the integrated circuit die and the connections.

In the present invention, there is excellent thermal dissipation because of direct heat flow from the integrated circuit die to a printed circuit board or a lower integrated circuit package; e.g., low thermal resistance throughout. Further, there is excellent electrical performance with very short signal paths, direct wire bonding over the terminals by the lined vias in the pads, and extremely low electrical resistance where pure copper (Cu) and gold (Au) are used in bonding and in the terminals.

Further, excellent routing density and flexibility is achieved with multiple peripheral rows, separate and/or multiple power and ground pads/terminals, and without a solder mask layer being required. An extremely thin and light package profile may be obtained using conventional assembly technology. This results in low assembly cost with the advantages that no coverlay tape prior to molding and no deflash and solder plating is required. Further, due to the thinness, high numbers of die may be created at saw singulation with low saw blade cost.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the scope of the included claims. All matters set forth herein or shown in the accompanying drawings are to be interpreted in an illustrative and non-limiting sense.

The invention claimed is:

1. A method of manufacturing an integrated circuit package comprising:
   forming a substrate including:
      forming a core layer;
      forming a through opening and vias in the core layer;
      forming a first conductive layer on the core layer covering the through opening;
      forming a second conductive layer on the core layer opposite the first conductive layer, the second conductive layer formed in the through opening and in the vias contacting the first conductive layer;
   bonding an integrated circuit die to the second conductive layer and in the through opening;
   forming connections between the integrated circuit die and the second conductive layer; and
   encapsulating the integrated circuit die and the connections.

2. The method as claimed in claim 1 wherein:
   forming the first conductive layer into terminals and a ground or thermal pad, the terminals extending out from the core layer; and forming the second conductive layer into an integrated circuit die bonded portion and terminals.

3. The method as claimed in claim 1 wherein:
forming the first conductive layer into terminals and a ground or thermal pad;
forming the second conductive layer into an integrated circuit die bonded portion and terminals; and
forming the terminals of the first and second conductive layers to have a shape of at least one of square, rectangular, and round.

4. The method as claimed in claim 1 wherein:
forming the second conductive layer into terminals and a ground or thermal pad; and
further comprising:
forming solder balls connected to the terminals in a plurality of rows.

5. The method as claimed in claim 1 wherein:
forming the first conductive layer forms a ground or thermal pad;
forming the second conductive layer into an integrated circuit die bonded portion and terminals; and
further comprising:
forming solder balls connected to the terminals.

6. The method as claimed in claim 1 wherein forming the second conductive layer forms blind vias in the vias.

7. The method as claimed in claim 1 wherein forming the first conductive layer forms a plurality of rows of terminals.

8. The method as claimed in claim 1 wherein forming the first conductive layer forms a plurality of terminals having at least one shape from a rectangle, square, and circle.

9. The method as claimed in claim 1 further comprising forming a solder mask over at least one of the first and second conductive layer.

10. The method as claimed in claim 1 further comprising:
forming a second substrate including:
 forming a core layer;
 forming a through opening and vias in the core layer;
 forming a first conductive layer on the bottom of the core layer covering the through opening;
 forming a second conductive layer on the top of the core layer, the second conductive layer formed in the through opening and in the vias contacting the first conductive layer, the second conductive layer in the vias formed into terminals;
bonding a second integrated circuit die to the second conductive layer of the second substrate and in the through opening thereof;
forming second connections bonding the integrated circuit die to the second conductive layer of the second substrate;
encapsulating the second integrated circuit die and the second connections; and
wherein:
forming the first substrate includes the first conductive layer thereof formed into terminals extending from the core layer thereof;
forming the first and second substrates are bonded with the terminals of the first and second substrates electrically connected.

11. The method as claimed in claim 10 wherein:
bonding the first and second substrates by at least one of solder, solder balls, conductive adhesive, or a combination thereof.

\* \* \* \* \*